(12) United States Patent
Hechtfischer et al.

(10) Patent No.: US 9,279,698 B2
(45) Date of Patent: Mar. 8, 2016

(54) METERING AND MEASURING-POINT SYSTEM FOR MEASURING AND METERING ELECTRICAL POWER/ELECTRICITY, AND A METHOD

(71) Applicant: UBITRICITY GESELLSCHAFT FÜR VERTEILTE ENERGIESYSTEME MBH, Berlin (DE)

(72) Inventors: Knut Hechtfischer, Berlin (DE); Frank Pawlitschek, Berlin (DE)

(73) Assignee: UBITRICITY GESELLSCHAFT FUR VERTEILTE ENERGIESYSTEME MBH, Berlin (DE)

( * ) Notice: Subject to any disclaimer, the term of this patent is extended or adjusted under 35 U.S.C. 154(b) by 0 days.

(21) Appl. No.: 14/116,452

(22) PCT Filed: Nov. 15, 2012

(86) PCT No.: PCT/EP2012/072738
§ 371 (c)(1),
(2) Date: Nov. 8, 2013

(87) PCT Pub. No.: WO2013/076001
PCT Pub. Date: May 30, 2013

(65) Prior Publication Data
US 2014/0125494 A1    May 8, 2014

(30) Foreign Application Priority Data

Nov. 25, 2011 (EP) ..................................... 11190742

(51) Int. Cl.
*G05B 23/00* (2006.01)
*G08C 15/06* (2006.01)
(Continued)

(52) U.S. Cl.
CPC .............. *G01D 4/00* (2013.01); *B60L 11/1848* (2013.01); *G01D 4/004* (2013.01); *H02J 13/002* (2013.01);
(Continued)

(58) Field of Classification Search
CPC ..... Y02T 90/14; Y02T 90/128; Y02T 90/163; Y02T 90/121; Y02T 90/122; Y02T 10/7088; Y02T 90/241; Y02T 90/242; H04Q 2209/60; H04Q 2209/845
USPC ............................. 340/870.02–870.03, 5.74; 439/133–134, 34; 324/76.11–157; 320/104; 307/149–157; 180/65.1; 700/286–298; 701/22
See application file for complete search history.

(56) References Cited

U.S. PATENT DOCUMENTS 4,352,992 A    10/1982 Buennagel et al.
2010/0134089 A1*  6/2010 Uram et al. ..................... 324/66
(Continued)

FOREIGN PATENT DOCUMENTS

DE    69509529    10/1999
EP    2192386 A1    6/2010
(Continued)

OTHER PUBLICATIONS

International Search Report for PCT/EP2012/072738, mailed on Mar. 8, 2013.
(Continued)

*Primary Examiner* — Firmin Backer
*Assistant Examiner* — Jerold Murphy
(74) *Attorney, Agent, or Firm* — Hauptman Ham, LLP (57) ABSTRACT

A metering and measuring point system for measuring and metering electrical energy/electricity drawn off and/or fed into a drawing off and/or feeding device at a fixed geographical point by a consumption unit, comprises one or more stationary drawing off and/or feeding devices that are connected to the power supply and configured for drawing off and/or feeding in electrical energy/electricity by means of consumption/generation units and at least one identifiable non-stationary functional unit for measuring and metering electrical energy/electricity that is conductively, via an electric conductor or inductively, drawn off or fed into one or more stationary drawing off and/or feeding devices by consumption/generation units.

20 Claims, 1 Drawing Sheet

(51) Int. Cl.
*H01R 13/44* (2006.01)
*H01R 33/00* (2006.01)
*B60L 9/00* (2006.01)
*H02J 7/14* (2006.01)
*G01D 4/00* (2006.01)
*B60L 11/18* (2006.01)
*H02J 13/00* (2006.01)

(52) U.S. Cl.
CPC .......... *B60L 2200/26* (2013.01); *B60L 2270/32* (2013.01); *Y02B 90/242* (2013.01); *Y02E 60/7815* (2013.01); *Y02T 10/7005* (2013.01); *Y02T 90/121* (2013.01); *Y02T 90/128* (2013.01); *Y02T 90/14* (2013.01); *Y02T 90/163* (2013.01); *Y02T 90/169* (2013.01); *Y04S 20/322* (2013.01); *Y04S 30/14* (2013.01); *Y04S 40/121* (2013.01)

(56) References Cited

U.S. PATENT DOCUMENTS

2011/0227755 A1* 9/2011 Hechtfischer et al. ... 340/870.02
2011/0298284 A1* 12/2011 Thomson et al. ............... 307/40

FOREIGN PATENT DOCUMENTS

EP 2258582 A2 12/2010
WO WO2010060927 * 6/2010

OTHER PUBLICATIONS

International Preliminary Report on Patentability From the International Bureau of WIPO mailed May 27, 2014 for PCT/EP2012/072738.
Korean Office Action dated Nov. 28, 2014.
Japanese Office Action dated Nov. 18, 2014.

* cited by examiner

METERING AND MEASURING-POINT SYSTEM FOR MEASURING AND METERING ELECTRICAL POWER/ELECTRICITY, AND A METHOD

CROSS REFERENCE TO RELATED APPLICATION

This application claims the priority of European Patent Application No. 11190742.4, filed on 25 Nov. 2011 in the European Patent and Trade Mark Office. Further, this application is the National Phase application of International Application No. PCT/EP2012/072738 filed on 15 Nov. 2012, which is incorporated herein by reference in its entirety.

FIELD OF THE INVENTION

The invention relates generally to a metering and measuring point system for measuring and metering the electrical energy/electricity (active and/or reactive power) drawn off by a consumption unit at a fixed geographical location from a drawing off device. The invention further relates to a method of measuring, metering and rendering an account of the electrical energy regardless of location.

BACKGROUND OF THE INVENTION

Electrical energy/electricity is presently predominantly supplied via grid connections that are permanently assigned to a property. These grid connections are permanently assigned to a power customer. Stationary energy meters are permanently installed for measuring, metering and rendering an account of the electrical energy/electricity drawn off via the grid connection. An account of the electrical energy/electricity drawn off or fed in via the grid connection is thus rendered to the power customer. No differentiation is made as to which person or which user draws off energy/electricity at each measured connection.

DE 695 09 529 (EP 0 769 218) describes a distribution network and suggests a solution to the problem of enabling accounting with respect to an individual subscriber that is not bound to a fixed geographical point, as disclosed, e.g., in SE 425 123, U.S. Pat. No. 4,352,992 or EP 0 047 089.

DE 695 09 529 describes a distribution network comprising electric wires, a plurality of tap-off facilities with at least one socket means for tapping off electric current and a computer unit communicating with the individual tap-off facilities over the power supply.

As far as switchable, these tap-off facilities are connected on the power connecting side with a so-called regulating device for identifying the user and switching the socket means.

The operator connecting a power-consuming unit to the tap-off facility is identified by the computer unit connected to the tap-off facility or the regulating means via a microprocessor installed in the power-consuming unit. Thus, in the system described in this document, the operator or power-consuming unit is identified by the tap-off facility or the central computer unit connected thereto. This is only possible since the tap-off facilities of the distribution network described in DE 695 09 529 are connected to computer units that are installed for this very purpose, since according to the invention disclosed in this document the tap-off facilities (in combination with the respective central computer units) must be capable of providing or retrieving information on the tap-off facility itself and, additionally, any information on all system users. According to DE 695 09 529, the identification process allowing the operator to draw off electricity by switching the regulating means is realised by communication between a computer unit installed for one or a small number of tap-off facilities for this very purpose and the tap-off facility, via signals superimposed on the distribution network. The distribution network according to the invention utilises the power line communication between the computer unit and the tap-off facility.

EP-A-2 192 386 discloses a metering and measuring point system for metering and measuring electrical energy consumption or generation. The system comprises a number of stationary drawing off devices that are connected to the power supply and configured for drawing off or feeding in electrical energy by means of consumption and/or generation units. These drawing off devices are tagged with an identifier enabling the identification of the grid connection holder. The system is moreover provided with at least one identifiable non-stationary functional unit for measuring and metering electrical energy that is drawn off or fed into one or more stationary drawing off devices by consumption and/or generation units via an electric conductor. The non-stationary functional unit comprises a device for detecting the identifier of the drawing off device, an identifiable device for metering and measuring the electrical energy drawn off and/or fed into the detected drawing off device, a device for storing the detected metering and measuring data as well as the detected identifier of the respective drawing off device and a device for reading out the stored data.

The metering and measuring point system described in EP-A-2 192 386 is i.a. characterized by a non-stationary, mobile metering technology. This system provides numerous advantages with respect to the costs of the connection points and thus the costs for the entire infrastructure. However, the mobile metering technology—e.g., in a vehicle—could also involve a certain attack scenario:

The attacker of the system does not only connect the registered system user to the de-energised drawing off device (which is thus at first protected against electricity theft), but instead connects several users to the drawing off device—for example by means of a Y-cable or any other device. Upon a successful authentication of the registered user, the drawing off device is energised. Electricity is then drawn off by all connected users, but since the meter is mobile, only the electricity drawn off by the registered user over the connected branch wire is metered. Thus, the other users take advantage of the activation by the legitimised user, more or less according to the "piggyback" principle, without the electricity they draw off or feed in being metered. By such a manipulation, an equitable allocation and rendering of account of the drawn off current to the user could consequently be circumvented.

SUMMARY OF THE INVENTION

It is therefore the object of the invention to provide protection against electricity theft, in particular for the known metering and measuring point system. This object is achieved by the subject-matter of the claims. Preferred embodiments are claimed in the dependent claims.

Moreover, the costs for the charging infrastructure in a mobile metering and measuring point system have to be reduced. It is therefore necessary to configure the protection mechanisms against attacks such that their costs do not thwart the system's approach of outstanding cost efficiency. The system of the invention is characterised in that it is not necessary to install a second stationary calibrated current meter on the infrastructure side.

The invention is based on a measuring and metering point system consisting of a (stationary) drawing off and/or feeding device that is permanently connected to the power supply and an identifiable non-stationary functional unit for measuring and metering electrical energy/electricity drawn off or fed into the stationary drawing off and/or feeding device by a consumption unit.

The system of the invention comprises a plurality of stationary drawing off and/or feeding devices that are connected to the power supply and configured for drawing off and/or feeding in electrical energy/electricity by means of consumption and/or generation units. Moreover, the system comprises at least one identifiable non-stationary functional unit for measuring and metering electrical energy/electricity that is conductively drawn off or fed into one or more stationary drawing off and/or feeding devices by consumption/generation units.

A measuring means is associated with each stationary drawing off and/or feeding device for measuring at least one physical parameter representing the electrical energy transmitted through the associated drawing off and/or feeding device. According to requirements, this means measurement of current, voltage, phase, power, etc. or active and/or reactive power.

A measuring means is also associated with the non-stationary functional unit for measuring at least one physical parameter representing the electrical energy transmitted between the associated drawing off and/or feeding device and the consumption/generation unit associated with the non-stationary functional unit. According to requirements, this means measurement of current, voltage, phase, power, etc. or active and/or reactive power or several of these parameters. The measuring means may either be a separate means of the non-stationary functional unit or the device for metering and measuring electrical energy/electricity described in EP-A-2 192 386 as part of the non-stationary functional unit.

Moreover, the system of the invention comprises a comparing means that compares the measurement at the connecting side (i.e., preferably the measured current and/or power) with the measurement at the drawing off and/or feeding side (i.e., preferably current and/or power). Preferably, the physical parameter measured at the connecting side and the physical parameter measured at the drawing off and/or feeding side (i.e. current or power etc.) are identical. Alternatively, the physical parameter measured at the connecting side and the physical parameter measured at the drawing off and/or feeding side are different and the comparing means is adapted to convert the measured physical parameters into comparable quantities.

Moreover, the invention provides for a device for monitoring the drawing off and/or feeding in of electricity at stationary drawing off and/or feeding devices. This device can preferably, but not exclusively be used in the metering and measuring point system of the invention. The device comprises a measuring means for measuring at least one physical parameter representing the electrical energy transmitted between the associated drawing off and/or feeding device and the consumption/generation unit associated with the non-stationary functional unit. According to requirements, this means measurement of current, voltage, phase, power etc. or active and/or reactive power. The measuring means is associated with a non-stationary functional unit.

Preferably, the measured values are stored. Moreover, a comparing means is provided that compares the current and/or power value(s) (or any other suitable comparative value) measured at the drawing off or feeding side, e.g. in an electric vehicle, with a provided measurement value of current and/or power (or any other suitable measurement value) measured at the connecting side (with regard to the location). It is also possible to separately calculate measurement values from the comparative values, e.g., so as to consider the active and the reactive power or take into account that the values to be compared are detected using different measuring methods and/or techniques, as already mentioned above.

Preferably, the device is provided for monitoring and preventing energy from being drawn off without authorisation.

According to an alternative embodiment, the system of the invention comprises a plurality of stationary drawing off and/or feeding devices that are connected to the power supply and suitable for inductively drawing off or feeding in electrical energy/electricity by means of consumption/generation units. Moreover, the system comprises at least one identifiable non-stationary functional unit for measuring and metering electrical energy/electricity that is inductively drawn off and/or fed into one or more stationary drawing off devices by consumption/generation units.

A measuring means for measuring a physical parameter is associated with each drawing off and/or feeding device, the physical parameter representing the current flowing through the associated drawing off and/or feeding device. According to requirements, this means measurement of current, voltage, phase, power etc. or active or reactive power.

A measuring means is also associated with the non-stationary functional unit for measuring a physical parameter representing the current flowing between the associated drawing off and/or feeding device and the consumption/generation unit the non-stationary functional unit is associated with. According to requirements, this means measurement of current, voltage, phase, power etc. or active or reactive power. The measuring means may either be a separate means of the non-stationary functional unit or the device for metering and measuring electrical energy/electricity described in EP-A-2 192 386 as part of the non-stationary functional unit. Moreover, the system of the invention is provided with a comparing means that compares the current and/or power measured at the connecting side with the current and/or power measured at the drawing off side, if necessary, upon additional calculations.

This alternative embodiment of the aforementioned device for monitoring the drawing off/feeding in of electricity serves for monitoring the inductive coupling between the drawing off/feeding device and the drawing off/feeding device, i.e. the non-stationary functional unit.

DETAILED DESCRIPTION

Figure 1:
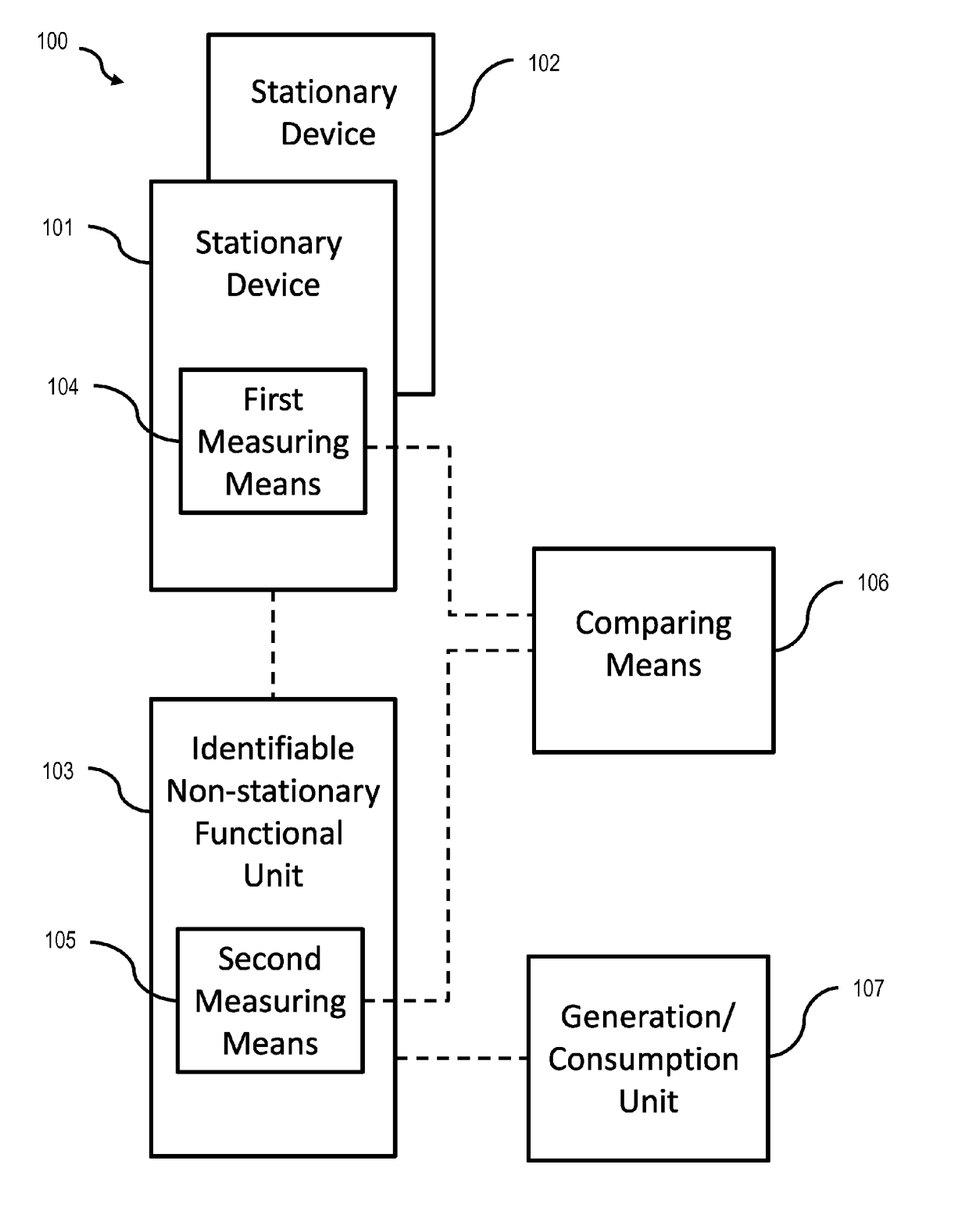
FIG. 1 is a block diagram of a metering and measuring point system according to some embodiments.

A metering and measuring point system 100 for metering and measuring electrical energy/electricity consumption and/or generation, wherein the system 100 comprises: at least one stationary device 101/102, wherein the stationary device is connected to a power supply and configured to draw-off at least one of electrical energy and electricity by a consumption unit 107 or feed at least one of electrical energy and electricity by using a generation unit; at least one identifiable non-stationary functional unit 103 configured to measure and meter at least one of electrical energy and electricity, wherein the at least one electrical energy and electricity to be measured and metered is conductively drawn off or fed into the at least one stationary device, via an electric conductor, and wherein the at least one electrical energy and electricity to be measured and metered is inductively drawn off or fed into the at least one stationary device; a first measuring means 104 that is associated with each of the at least one stationary device, wherein the first measuring means is configured to measure at least one first physical parameter representing the electrical energy transmitted through the at least one stationary device that is associated with the first measuring means; a second measuring means 105 that is associated with the at least one identifiable non-stationary functional unit, wherein the second measuring means is configured to measure at least one second physical parameter representing the electrical energy transmitted between the at least one stationary device and at least one of the consumption unit and generation unit that is associated with the at least one identifiable non-stationary functional unit; and a comparing means 106 configured to compare the at least one first physical parameter measured at the first measuring means with the at least one second physical parameter measured at the second measuring means.

Drawing Off and/or Feeding Device

First, the stationary drawing off and/or feeding device will be discussed. Consumption and/or generation units are connected to the power supply by means of (stationary) drawing off and/or feeding devices that are permanently connected to the power supply. As a rule, this is conductively achieved. Thus, basically a socket of any construction type is involved. Different types of conductive connections are possible, whether for single-phase or multi-phase alternating current, heavy current, direct current, etc.

In case of an inductive drawing off and/or feeding device, e.g., a, possibly in-ground, conductor loop may be involved.

A means for measuring the current and/or power of the current flowing through the associated drawing off device is associated with a drawing off and/or feeding device. This measuring means at the connecting side is configured to perform measurements at equal or varying time intervals and/or stochastic measurements at predetermined or random time intervals. Moreover, the measuring means at the connecting side is configured to provide the measurement values as instant values and/or average values for time intervals of arbitrary constant or variable length.

According to the invention, the drawing off and/or feeding device, however, is not provided with a current meter.

The drawing off and/or feeding device is moreover preferably provided with a communication unit communicating the determined measurement values to the comparing means. This can either be achieved automatically or upon request by the comparing means or the non-stationary functional unit.

The drawing off and/or feeding device is preferably provided with an identifier enabling the identification of the owner of the drawing off and/or feeding device for accounting purposes. This identifier may be unique (if required, several drawing off devices are assigned to one person). In its simplest form, it suffices that the drawing off and/or feeding device is provided with a number as identifier which is printed on the drawing off and/or feeding device and by means of which the drawing off and/or feeding device can be identified. Any other form of (e.g. visual or electronic) identification is likewise possible. The drawing off and/or feeding device may also be tagged by means of a microprocessor.

With the identifier, each drawing off and/or feeding device may unambiguously be allocated to an accounting partner, i.e. the subscriber so as to make accounting possible. This is for example accomplished by a comparison of the identifier with the information on the grid connection subscriber stored in a database or any other device. It is possible to store further information on the drawing off and/or feeding device.

Non-Stationary Functional Unit

Apart from the drawing off/feeding device, a further component of the metering and measuring point system is a non-stationary functional unit that is not permanently connected to the power supply and essentially consists of a current meter and further (known) devices for detecting the identifier of the drawing off/feeding device and for storing the measuring and metering data as well as the used drawing off/feeding device, and a device for reading out the stored data.

A current and/or power measuring means for measuring the current flowing from each drawing off and/or feeding device to the consumption/generation unit with which the functional unit is associated with the non-stationary functional unit according to the invention. This measuring means may be part of the non-stationary functional unit. Alternatively, however, the measuring means is physically and, if necessary, even spatially separated from the non-stationary functional unit. The measuring means may also be the device for measuring and metering electrical energy/electricity described in EP-A-2 192 386 as part of the non-stationary functional unit. The measuring means at the drawing off side is also configured for or capable of performing measurements at equal or varying time intervals and/or stochastic measurements at predetermined or random time intervals. The measuring means at the drawing off side is moreover preferably configured to provide the measurement values as instant values and/or average values for time intervals of arbitrary equal or variable length.

The non-stationary functional unit forms a metering and measuring point system together with the drawing off and/or feeding device, which is identifiable on account of the identifier. The non-stationary functional unit is likewise unambiguously identifiable. It is also possible to assign a fixed identifier permanently to the unit (for example by use of a current meter number that is assigned only once). Apart from of instead of a permanent meter number, it is moreover possible that each user assigns an identifier to the unit (as similarly with a mobile, that becomes an unambiguously identifiable system subscriber only when the SIM card is inserted) or modifies the permanent identifier.

The non-stationary functional unit consequently comprises preferably the following technical devices whose spatial disposition and/or technical implementation is/are variable:

(1) Device for detecting the identifier of the drawing off/and or feeding device There is a need for a device for detecting the identifier of the drawing off and/or feeding device that can be realised in different manners. The identifier is for example manually detected by an operator, e.g. by reading the identifier at the drawing off device and registering, inputting etc. this identifier in a suitable device (such as inputting into a respective device). An automated detection of the identifier is preferred. It may be performed by the user (in that this person holds a device provided for reading in and storing the identifier against the drawing off and/or feeding device, whereupon the identifier is fed into this device) or automatically (in that the identifier of the drawing off and/or feeding device is automatically read out using corresponding. e.g. wireless, techniques). This is preferably achieved by barcodes and respective readers or by RFID tags and RFID readers.

(2) Identifiable device for metering and measuring

Moreover, the non-stationary functional unit is provided with a device for metering and measuring the electrical energy/electricity drawn off and/or fed into the drawing off and/or feeding device that has been detected before by means of the consumption and/or generation unit. This device is a current meter (preferably a bidirectional load profile meter for one- or multi-phase AC current), whose functionality in particular may strongly vary and depends on the operating environment of the non-stationary metering and measuring point.

(3) Device for storing data

Moreover, a device for storing the metering and measuring data detected by the functional unit as well as the detected identifier of each used drawing off and/or feeding device is provided. This may be a memory chip, a hard disk or any other memory means in which the data are stored or at least cached for further use.

(4) Device for reading out the stored data

Finally, a device for reading out the stored data is provided. It has to be possible to read out both the measuring data and the identifier of each used drawing off and/or feeding device from the memory for further processing. There are various techniques of reading out the data. As a rule, a data interface will be used to read out the data in different manners (depending on the type of interface) manually or completely or partially automatically. An interface for fully automatic remote reading is for example possible, wherein the data are for example radioed to a central computer unit. An interface for semi-automatic read-out is also possible (wherein, for example, the operator connects the storage medium to a data communication device using an interface and transmits the data to a central computer unit). A device for manual/visual read-out of data is also possible (such as a display, from which the displayed data can be retrieved manually or in any other way before being transmitted).

There are various ways of positioning the aforementioned devices of the functional unit. In particular, a narrow spatial connection, e.g. in that all devices are arranged in one place, e.g. in one device, is unnecessary. It is decisive that the aforementioned devices co-operate as a functional non-stationary unit in the manner as described. The devices or components of the functional unit are not part of the drawing-off device, but are all or at least in part arranged outside the drawing-off and/or feeding device, preferably all within the consumption and/or generation unit. By this arrangement, it is guaranteed that only one set of the devices described under (1) to (4) is required per mobile consumption and/or generation unit. Unlike in DE 695 09 529, additional computer units communicating with or controlling the drawing-off and/or feeding device and/or a communication by means of signals superimposed on the power supply are unnecessary. The drawing-off and/or feeding device is simple to install and no works on the power supply infrastructure are necessary.

In one embodiment, the non-stationary functional unit is completely or in part arranged outside the consumption and/or generation unit and completely or predominantly arranged outside the drawing-off and/or feeding device, as a separate module. In this case, the technical devices or components are all or in part integrated in a device that is sandwiched between the consumption and/or generation unit and the drawing off and/or feeding device. Thus, consumption and/or generation units that do not comprise of devices (1) to (4) are capable of utilising the full functionality of the non-stationary metering and measuring point.

Comparing Means

Moreover, a comparing means in the form of a physical comparing unit or in the form of a corresponding software is provided which compares the current and/or power measured at the drawing off side with a current and/or power value measured at the connecting side, wherein calculations may be required for the purpose of comparison. The comparing means is preferably configured to initiate an action if the compared measuring values differ to such an extent that a given difference threshold is exceeded. The comparing means causes the drawing-off device to be de-energised or the non-stationary functional unit to be notified, e.g. by means of a corresponding control unit.

Preferably, the comparing means or unit is part of the non-stationary functional unit. Alternatively, the comparing means or unit is part of the stationary device.

Alternatively, a remote comparison is made, i.e. the comparing means is neither part of the stationary nor the non-stationary unit but part of the central unit or central computer unit. The comparison need not be made simultaneously with the drawing off or feeding step but may also be made afterwards.

Communication between the drawing off means and the comparing means/unit and/or the non-stationary functional unit is wireless or via a wire.

Additional Preferred Embodiments of the Metering and Measuring Point System

The following preferred embodiments may increase the functionality of the metering and measuring point system of the invention.

The detection of the identifier of the drawing off and/or feeding device by the non-stationary functional unit can preferably be automated by electronic tagging of the drawing off device (by means of, e.g. a microprocessor) and read-out of this identifier by the non-stationary functional unit (again by means of a microprocessor). Coding is also possible, i.e. coded data transmission. Communication may either be wireless (e.g., Bluetooth, WLAN, NFC, etc.) or via a wire that may also be integrated into the connection line between the drawing off and/or feeding device and the non-stationary functional unit. If the non-stationary functional unit is positioned in the consumption and/or generation unit, the "data wire" may also be part of the connection cable of the consumption and/or generation unit.

The non-stationary functional unit may additionally comprise a device for measuring/testing the continuity and duration of the electrical connection to the drawing off and/or feeding device, either at intervals or perpetually. The determined duration of the electrical connection may be stored in a correspondingly modified storage device.

The non-stationary functional unit is moreover preferably configured such that it only permits a consumption and/or generation unit (or its user) to draw off/feed in electrical energy/electricity if the unit is an authorised system subscriber. To this end, the drawing off unit may be provided with a switch which (for reasons of operational reliability and safety and legal certainty) only permits a current flow if the non-stationary functional unit identifies the consumption and/or generation unit or its user to be authorised for drawing/feeding electricity off/into the drawing off and/or feeding device.

According to this preferred embodiment, the non-stationary functional unit reads out the identifier of the drawing off and/or feeding device. Subsequently, the non-stationary functional unit or a computer unit communicating with the unit checks whether the unit is authorised to draw/feed electricity off/into the drawing off unit. In the event of a positive result, the non-stationary functional unit transmits to the electronic lock of the drawing off device a corresponding signal (an electronic key in a way) that causes the switch pertaining to the drawing off and/or feeding device to get closed.

Finally, the drawing off and/or feeding device may re-open the switch by means of an electronic lock upon request of the non-stationary functional unit or if the electrical connection between the non-stationary functional unit and the drawing off and/or feeding device is interrupted (for example if there is no longer a signal to keep the switch closed) and may interrupt voltage and current flow.

The non-stationary functional unit can moreover be combined with a device for communication and remote read-out. The data detected at the non-stationary metering and measuring point and stored in the non-stationary functional unit have to be transmitted for further processing, in particular rendering an account. The transmission of the stored data (metering and measuring data as well as identifier of the drawing off and/or feeding device and, perhaps, duration of the connection) is a central part of any measuring and accounting system. Moreover, communication towards the non-stationary functional unit is possible, e.g. for authorising switching of the drawing off and/or feeding device or transmission of further data that may be used for controlling, if necessary.

The data are transmitted by means of this device to a computer unit that processes them. The accounting for the drawing/feeding processes off/into a drawing off device detected by each non-stationary functional unit is based on this data processing. The data may be transmitted using various transmission techniques. A wireless, automated (perpetual or intervallic) remote data transmission by means of a suitable communication device is in particular possible. Such a communication device can use existing mobile radio networks (having different data transmission protocols), a Wireless Local Area Network (WLAN) or other (mobile) radio technologies. The data may be transmitted in uncoded or—which is desirable and contributes to data security—coded form.

It is also possible to combine the non-stationary metering and measuring point with a semi-automated data transmission, wherein the operator for example manually initiates data transmission by means of the non-stationary functional unit via an interface (using wireless or wired technologies).

The non-stationary functional unit may be combined with a database in which certain information on individual or groups of drawing off and/or feeding devices (identifiable by their identifier) exceeding the data necessary for identifying the drawing off and/or feeding device and its owner is stored. Such information includes for example electricity tariffs associated with the power connection of the drawing off device, performance characteristics of the drawing off and/or feeding device (how efficiently can electrical energy/electricity be drawn off from or feed into the drawing off and/or feeding device) or any individual load profiles of the drawing off device with which the consumption and/or generation unit can draw off or feed in electrical energy/electricity.

With this information, all desired parameters of the drawing off and/or feeding device can be detected and made available. Thus, it is possible to design the technical structure of the drawing off device particularly simple and to transmit only minimal data amounts during the communication (i.e. the connection identifier).

In a modification of the aforementioned embodiment, the database may also be completely or partially deposited in the data memory of the database combined with the non-stationary functional unit. The database may be updated perpetually or at intervals by means of the communication interface of the non-stationary functional unit.

Additionally, the non-stationary functional unit may comprise a device for automatically controlling the consumption or generation of electrical energy/electricity of a connected consumption and/or generation unit. It is provided for enabling an automatically controlled integration of consumption and/or generation units into the power network. The automatic control device is preferably disposed within the consumption and/or generation unit and is controlled via the communication device of the non-stationary functional unit. The device can be configured such that it is provided by the central computer unit using wireless transmission with a start or end signal or any other signal for modifying the drawing off/feeding process to the consumption and/or generation unit, and the load profile is automatically controlled in accordance therewith.

In the following, preferred embodiments will be explained.

The invention can be used in the field of electromobility. The following preferred embodiments represent typical applications in this field. In the following description, an electric vehicle is selected as consumption and generation unit into which the non-stationary functional unit according to the invention is integrated. The non-stationary functional unit and the drawing off and/or feeding device together form the prerequisites of a metering and measuring point system according to the invention.

Connection Identification

When the electric vehicle is connected to the drawing off and/or feeding device, the switch integrated in the drawing off device is first open. There is no current flow. Upon connection of the electric vehicle and the drawing off device, the reader of the electric vehicle can read out the identifier of the drawing off and/or feeding device. The reading-out process may be wireless or wired, using for example the cable with which the electric vehicle is connected to the drawing off and/or feeding device. The read-out identifier is stored in the memory.

Authorisation of the Non-Stationary Functional Unit

The identifier is then used to initiate the authorisation of the switching process for the switch integrated in the drawing off device. This may be accomplished in that the electric vehicle transmits the identifier of the drawing off and/or feeding device, using its communication module, to a central computer unit, which sends a signal to the electric vehicle on account of data stored with respect to the drawing off and/or feeding device and the user of the electric vehicle; this signal qualifies the electric vehicle or its user as being authorised or not authorised to draw/feed electrical energy/electricity off/into the respective connection point. Here, the central computer unit may take into account whether the user is in default of payment for previous withdrawals or whether his/her electric vehicle may/should draw current off the respective drawing off and/or feeding device.

Communication of Open/Closed-Loop Control Parameters

Moreover, the central computer unit may provide the electric vehicle with further data determining the later withdrawal. For example, the maximum charging capacity stored with respect to the drawing off device, a certain charging profile or the like may be transmitted. This may be accomplished in accordance with further data (such as data on the charge state of the accumulators) that were transmitted before to the central computer via the communication unit and adapted to the stored data on the consumption and/or generation unit.

Switching of the Drawing Off and/or Feeding Device

When provided with an authorisation signal, the electric vehicle sends the electronic key to the electronic lock of the drawing off and/or feeding device by means of the used electronic method. If the authorisation signal (such as a certain code) corresponds to the requirements of the electronic lock, the latter closes the switch so that electrical energy/electricity can be drawn off or fed in (if necessary, in view of the restrictions transmitted by the central computer unit for this drawing off device and this subscriber).

According to a modification thereof, it is also possible to store all data relating to the individual drawing off and/or feeding devices, the switching/decoding process, the electric vehicle and its user not or not exclusively in a central computer unit but a memory unit of the electric vehicle itself. Thus, when the connection is made, communication with the central computer unit is at first unnecessary. In this modification, the data stored in the memory are compared to the data stored in the central computer unit at regular or irregular intervals (automatically or by manual initiation).

Load Profile Measuring/Metering

The electricity meter installed in the electric vehicle as part of the functional non-stationary unit (such as a load profile meter) meters the energy/electricity drawn off/fed in. The drawing off/feeding process is continued until being terminated (i) by the user of the electric vehicle (e.g., conductively by pulling the plug or inductively by driving the vehicle away), (ii) by the consumption and/or generation unit itself (e.g., for lack of demand, for example if the accumulator is fully charged) or—as far as installed—(iii) by the automatic control device. The automatic control device only becomes active upon a request that is preferably sent by the central computer unit to the non-stationary functional unit which passes it on to the automatic control device. An independent automatic control of consumption by the battery management system of the electric vehicle is not excluded thereby. The meter transmits the measured load profile—if applicable, together with the basic temporal data (start/end)—to the memory unit, which stores the load profile together with the information on the identifier of the drawing off device in an electronic memory.

Moreover, as soon as the authorised system subscriber (i.e. the consumption and/or generation unit) is authorised to draw off or feed in energy, the current and/or power in the drawing off device and the mobile, non-stationary functional unit (within the vehicle, the cable, etc.) is/are measured. The measurement is either capacitive, inductive or resistive and is made, for example, by a measuring resistor, a Hall sensor or any other measuring device. The differentiation between current metering and current measuring is decisive here. While current is metered in the non-stationary functional unit but not in the drawing off device, current is measured according to the present invention on both sides, i.e. in the drawing off and/or feeding device and in the functional unit; in the non-stationary unit, measuring is preferably accomplished by the measuring technology of the meter.

Current is preferably measured on both sides perpetually and at equal time intervals. However, the measurement is not necessarily made at certain time intervals. Statistic methods are preferred for data reduction. Instantaneous values are e.g. processed or integrated and compared over a period of time. The invention also covers combinations of instantaneous values and integrals or a step-by-step approach.

The values measured in the drawing off device and the mobile unit are then compared by a comparing means (that may comprise measurement technology) that is completely or partially integrated in the drawing off device and/or the mobile unit. If the comparing means is only in the drawing off and/or feeding device or only in the functional unit, the measurement values detected at the respective other end are transmitted to the comparing means.

The comparison is made perpetually and/or periodically and/or at variable (random or non-random) time intervals that can preferably be based on parameters.

The measuring values are preferably electronically analysed in a control unit or interpreted on the basis of certain parameters. Via a suitable method in accordance with predetermined factors, an action is triggered.

In case of conductive charging, for example, a further means may be included, connected downstream and/or informed before, during or after the action over a suitable interface (such as a call to the driver, an inquiry call to the control centre, message to infrastructural partners etc.). If the values differ so that they exceed certain threshold values, it can be assumed that not only the legitimate user is or was connected to the drawing off and/or feeding device, but one or more illegitimate users that draw off of feed in or have drawn off or fed in current in addition to the legitimate user. If, for example, the result of the comparison exceeds the threshold, the drawing off and/or feeding device is de-energised. Other actions are alternatively or additionally conceivable. The mobile subscriber may for example be denied access.

Preferably, the control unit sends an alarm signal to the central administration unit (control centre). Due to the alarm signal, future authorisations of the respective system user will not be successful as long as the alarm is not lifted, and the connection units can no longer be energised by this system user.

Depending on the arrangement of the control unit, the drawing off unit can be de-energised by the drawing off and/or feeding device itself or the mobile functional unit.

In case of inductive charging, the triggered action may for example consist in signalling the driver that inductive coupling has not or not yet sufficiently been accomplished and that the vehicle should therefore be moved with respect to the drawing off and/or feeding means so as to optimise coupling.

Accounting for Consumption

A communication module, preferably the communication module of the electric vehicle, transmits the stored data (immediately or with a time delay) to a central computer unit that stores the data in its database. The data are used to render an account for the individual drawing off processes of those involved (user of the electric vehicle, operators of the drawing off device) while taking the data stored in the database of the central computer unit on the drawing off and/or feeding device. Thus, a differentiation according to individual drawing off and/or feeding devices can be made, while additionally temporal data and any other stored data on the drawing-off procedures can be taken into account.

The solution according to the invention involves various advantages.

With the solution according to the invention, it is in particular possible, in view of the fact that electromobility is increasingly often introduced,
  to draw or feed electrical energy/electricity off or into the power supply (drawing off devices) at various (stationary) points, such as on public streets, in car parks etc.;
  to clearly assign the energy/electricity drawn off/fed into the drawing off device to a consumption and/or generation unit or its user (e.g., the electric vehicle or its user, hereinafter also the "system subscriber") and render an account thereof to the latter or the owner of the drawing off device;
  and
  to prevent misuse.

By providing drawing off and/or feeding devices across the whole area in different parking situations, it is possible for the users to connect their electric vehicles as frequently and long as possible to the power supply so that the electric vehicles are extensively available for a regular and thus quite valuable integration into the power grid. It is currently estimated that each consumption and/or generation unit (such as an electric vehicle) requires approximately four drawing off devices (i.e. at home, at work, during shopping and during leisure time). However, it is not sufficient to merely install drawing off devices to provide an infrastructure that meets the requirements of electromobility. However, the system of the invention makes it possible

- to identify the consumption and/or generation unit (and/or its user) intending to draw electrical energy/electricity off a drawing off device as an authorised system subscriber;
- to energise a drawing off device, which by default is de-energised (switched off) for safety reasons, for usage only;
- to measure and meter the energy/electricity drawn off or fed in;
- to prevent misuse when current is drawn off;
- to relock the drawing off device upon termination of the drawing off/feeding process (current flow is no longer possible, switching off);
- to transmit the result of the electricity measuring/metering to an accounting centre; and
- to render an account of the energy/electricity drawn off/fed into the respective drawing off device to each owner of draw off and/or feeding devices and consumption and/or generation units.

Accounting of the drawn off electrical energy/electricity can be subscriber-based (related to a consumption and/or generation unit or its user) and does not have to exclusively relate to a fixed geographical point.

So as to keep the costs for each drawing off device as low as possible, the invention provides for an as far as possible simple technical infrastructure for the drawing off and/or feeding devices.

The identification, communication, accounting and control processes use an infrastructure that is already available so that at the power supply side no technology except the drawing off and/or feeding devices (which have a simple structure and are easy to install) are necessary. Thus, there is no need for a permanently installed current meter as well as communication at the power supply side (e.g. computer units automatically controlling the drawing off and/or feeding devices).

The number of system components required for non-stationary accounting is limited in that these components are not arranged in the element that is most frequently required in the system (the drawing off devices) but outside thereof, preferably in the consumption and/or generation units.

Information to be stored on the drawing off and/or feeding device (such as owner, current tariff, exact position, power specifications) are not stored in a corresponding device of the drawing off device itself or a computer unit installed for each drawing off device or a group of drawing off devices, but preferably in a central database. By means of this database, each drawing off device can be provided with any information on the connection. The drawing off and/or feeding device itself only has to be provided with an identifier permitting the identification of the connection subscriber (e.g. by means of information stored in the database).

The metering and measuring point system according to the invention permits a simple way of exact metering and measuring of electrical energy/electricity drawn off/fed into the power supply regardless of location. According to the disclosed solution, the electrical energy/electricity is not solely measured and metered as a function of a fixed geographicalal connection point to the power supply but as a function of individual consumption and/or generation units or their users (system subscribers) that use such a connection point (non-stationary metering and measuring point).

This concept also involves the advantage that the technical requirements for the drawing off and/or feeding device (and thus the costs for each individual drawing off and/or feeding device) are minimised. In particular, there is no need for additional computer units and/or additional technology, in particular communication over signals superimposed on the power supply, for each drawing off and/or feeding device or for groups of drawing off and/or feeding devices.

Although the invention is illustrated and described in detail by the description, this detailed description is meant to be only illustrative and exemplary and does not restrict the invention. Of course, skilled persons can make changes and modifications without leaving the scope of the following claims. In particular, the invention also encompasses embodiments comprising any combination of features mentioned or illustrated above in connection with different aspects and/or embodiments.

Moreover, the term "comprise" and derivations thereof does not exclude other elements or steps. Moreover, the indefinite article "a(n)" and derivations thereof do not exclude a plurality. The functions of several features mentioned in the claims may be performed by a unit. The terms "substantially", "about", "approximately" and the like in connection with a property in particular also define this very property.

The invention claimed is:

1. A metering and measuring point system for metering and measuring one or more of electrical energy consumption or generation, the system comprising:
   a stationary device connected to a power supply, the stationary device being configured to have electrical energy consumed by a consumption unit drawn off from the stationary device, or to have electrical energy generated by a generation unit fed into the stationary device, the stationary device comprising:
      a first electrical conductor; and
      a first measuring device configured to measure a first parameter representative of an amount of electrical energy transmitted through the first electrical conductor;
   an identifiable non-stationary functional unit configured to measure and meter the electrical energy drawn off from or fed into the stationary device, wherein the identifiable non-stationary functional unit comprises:
      a second electrical conductor configured to be electrically coupled with the first electrical conductor;
      a third electrical conductor configured to be electrically coupled with one or more of the consumption unit or the generation unit; and
      a second measuring device between the third electrical conductor and the second electrical conductor, and configured to measure a second parameter representative of an amount of electrical energy transmitted through the third electrical conductor to the consumption unit or from the generation unit; and
   a comparing device configured to compare the first parameter with the second parameter, the comparing device being a component of at least one of the stationary device or the identifiable non-stationary functional unit, wherein the comparing device is configured to cause the transmission of electrical energy through the first conductor to stop based on a determination that the first parameter deviates from the second parameter by more than a predetermined threshold value.

2. The metering and measuring point system according to claim 1, wherein the first measuring device and the second measuring device are configured to one or more of
   perform periodic measurements at equal or varying time intervals, or perform stochastic measurements at predetermined time intervals.

3. The metering and measuring point system according to claim 1, wherein the first measuring device and the second measuring device are configured to provide measurement values for the first parameter and for the second parameter as instant values or average values for time intervals of arbitrary constant or variable length.

4. The metering and measuring point system according to claim 1, wherein the comparing device is configured to cause the stationary device to actuate a switch to stop the transmission of the electrical energy through the first conductor, and the comparing device is further configured to communicate a notification to the non-stationary functional unit indicating the deviation between the first parameter and the second parameter exceeded the predetermined threshold value.

5. The metering and measuring point system according to claim 1, wherein the identifiable non-stationary functional unit comprises the comparing device.

6. The metering and measuring point system according to claim 1, wherein the stationary device is configured to communicate with the identifiable non-stationary functional unit by way of a wired or a wireless connection.

7. The metering and measuring point system according to claim 1, wherein the first electrical conductor is coupled with the second electrical conductor by way of a conductive coupling, and a deviation between the first parameter and the second parameter greater than the predetermined threshold value is indicative of electrical energy theft by way of the conductive coupling.

8. The metering and measuring point system according to claim 1, wherein the stationary device further comprises an identifier usable to identify a grid connection subscriber.

9. The metering and measuring point system according to claim 8, wherein the identifiable non-stationary functional unit is configured to
    detect the identifier of the stationary device,
    store data indicative of the metered and measured electrical energy drawn off from or fed into the stationary device,
    store the detected identifier of the respective stationary device in use as detected, and
    output the stored data and the identifier to a computer.

10. The metering and measuring point system according to claim 9, wherein the computer is located remotely from the stationary device and the identifiable non-stationary functional unit, and the identifiable non-stationary functional unit is configured to communicate with the computer by way of a wireless communication channel to facilitate a remote readout of the stored data.

11. The metering and measuring point system according to claim 8, wherein
    the identifier is an electronic identifier, and
    the identifiable non-stationary functional unit is configured to electronically detect the electronic identifier.

12. The metering and measuring point system according to claim 1, wherein the first measuring device is other than a calibrated current meter, and the stationary device is incapable of communicating with a computer to receive control commands independent of the identifiable non-stationary functional unit.

13. The metering and measuring point system according to claim 1, wherein the first parameter and the second parameter are values having different units of measurement, and the comparing device is configured to convert the one or more of the first parameter or the second parameter to comparable units to compare the first parameter with the second parameter.

14. A method of measuring and metering one or more of electrical energy consumption or generation, the method comprising:
    electrically coupling an identifiable non-stationary functional unit with a stationary device having connectivity to a power supply, the stationary device being configured to have electrical energy consumed by a consumption unit drawn off from the stationary device, or to have electrical energy generated by a generation unit fed into the stationary device, wherein the stationary device comprises a first electrical conductor and the identifiable non-stationary functional unit comprises a second electrical conductor configured to be electrically coupled with the first electrical conductor;
    metering and measuring the electrical energy drawn off from or fed into the stationary device using the identifiable non-stationary functional unit, one or more of the consumption unit or the generation unit being electrically coupled with a third conductor of the identifiable non-stationary functional unit, downstream from the second electrical conductor with respect to the first electrical conductor;
    measuring a first parameter representing an amount of electrical energy transmitted through the first electrical conductor;
    measuring a second parameter representing an amount of electrical energy transmitted through the third conductor to the consumption unit or from the generation unit;
    comparing the first parameter with the second parameter to determine a deviation amount between the first parameter and the second parameter; and
    causing the transmission of electrical energy through the first electrical conductor to be stopped based on a determination that the deviation amount exceeds a predetermined threshold value,
    wherein the comparison of the first parameter with the second parameter is performed by one or more of the stationary device or the identifiable non-stationary functional unit, and a decision to stop the transmission the electrical energy through the first electrical conductor is made by at least one of the stationary device or the identifiable non-stationary functional unit.

15. The method according to claim 14, wherein one or more of the first parameter or the second parameter are measured by performing periodic measurements at equal or unequal time intervals, or by performing stochastic measurements in predetermined or random time intervals.

16. The method according to claim 14, wherein electrically coupling the identifiable non-stationary functional unit with the stationary device comprises conductively coupling the first electrical conductor and the second electrical conductor.

17. The method according to claim 14, wherein electrically coupling the identifiable non-stationary functional unit with the stationary device comprises inductively coupling the first electrical conductor and the second electrical conductor.

18. The method according to claim 14, wherein the identifiable non-stationary functional unit comprises a comparison device configured to compare the first parameter with the second parameter, and the non-stationary functional unit instructs the stationary device to actuate a switch to stop the transmission of electrical energy through the first electrical conductor.

19. The metering and measuring point system according to claim 6, wherein the comparing device is configured to cause the transmission of electrical energy through the first electrical conductor to be stopped independent of a communication outside of the wired or wireless connection between the stationary device and the identifiable non-stationary functional unit.

20. A mobile device, comprising:
- a metering and measuring unit having a first end and a second end, the first end of the metering and measuring unit being configured to be electrically coupled with an electrical conductor of a stationary device having connectivity to a power supply, the second end of the metering and measuring unit being configured to be electrically coupled with one or more of a consumption unit or a generation unit, wherein the metering and measuring unit is configured to meter and measure an amount of electrical energy drawn off from the stationary device by the consumption unit or fed into the stationary device by the generation unit;
- a first measuring device configured to measure a first parameter representative of an amount of electrical energy transmitted through the second end of the metering and measuring unit between the metering and measuring unit and at least one of the consumption unit or the generation unit; and
- a comparing device configured to compare the first parameter with a second parameter measured by a second measuring device of the stationary device on a power supply side of the electrical conductor of the stationary device with respect to the first end of the metering and measuring unit, the second parameter being representative of an amount of electrical energy transmitted through the electrical conductor of the stationary device, wherein
  - the comparing device is configured to be communicatively coupled with the stationary device and to cause the stationary device to stop the transmission of electrical energy through the electrical conductor based on a determination that the first parameter deviates from the second parameter by more that a predetermined threshold value,
  - the metering and measuring unit is configured to wirelessly communicate with remote computer, and
  - the comparing device is configured to cause the stationary device to stop the transmission of electrical energy through the electrical conductor independent of the remote computer.

* * * * *